(12) United States Patent
Choi et al.

(10) Patent No.: US 7,482,854 B2
(45) Date of Patent: Jan. 27, 2009

(54) E-FUSE CIRCUIT USING LEAKAGE CURRENT PATH OF TRANSISTOR

(75) Inventors: Jeong-Un Choi, Yongin-si (KR); So-Hee Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 242 days.

(21) Appl. No.: 11/409,988

(22) Filed: Apr. 25, 2006

(65) Prior Publication Data

US 2006/0244510 A1 Nov. 2, 2006

(30) Foreign Application Priority Data

Apr. 26, 2005 (KR) .................. 10-2005-0034667

(51) Int. Cl.
*H01H 37/76* (2006.01)
(52) U.S. Cl. .................... 327/525; 365/225.7
(58) Field of Classification Search ................ 327/525, 327/526; 363/225.7
See application file for complete search history.

(56) References Cited

U.S. PATENT DOCUMENTS

| 5,838,624 A * | 11/1998 | Pilling et al. ............. 365/225.7 |
|---|---|---|
| 6,108,261 A | 8/2000 | Kim et al. |
| 6,150,868 A | 11/2000 | Kim et al. |
| 6,426,668 B1 * | 7/2002 | Morrish et al. ............... 327/525 |
| 6,426,910 B1 * | 7/2002 | Santin ...................... 365/225.7 |
| 6,549,063 B1 * | 4/2003 | Lehmann et al. ............ 327/525 |
| 6,597,234 B2 * | 7/2003 | Reber et al. .................. 327/525 |
| 7,002,219 B1 * | 2/2006 | de Jong et al. .............. 257/357 |
| 7,061,304 B2 * | 6/2006 | Anand et al. ................. 327/525 |
| 2002/0018362 A1 * | 2/2002 | Blodgett ...................... 365/177 |
| 2004/0042317 A1 * | 3/2004 | Marr et al. ................... 365/225 |

FOREIGN PATENT DOCUMENTS

| JP | 2000-082296 | 3/2000 |
|---|---|---|
| JP | 2000-090689 | 3/2000 |
| JP | 2001-067893 | 3/2001 |
| KR | 1020000004729 | 1/2000 |
| KR | 1020000004730 | 1/2000 |

* cited by examiner

*Primary Examiner*—Lincoln Donovan
*Assistant Examiner*—Thomas J Hiltunen
(74) *Attorney, Agent, or Firm*—Volentine & Whitt, PLLC

(57) ABSTRACT

An e-fuse adapted to indicate programming state in relation leakage current path defined by a program transistor both before and after dielectric breakdown has occurred. The e-fuse comprises: a program circuit including the program transistor, a switch circuit connected between the program circuit and ground, a current supply circuit connected to the program circuit and supplying a predetermined current to the leakage current path after the program transistor is programmed; and a sense/amplification circuit connected to a program node associated with the leakage current path and adapted to sense and output the programming state.

12 Claims, 2 Drawing Sheets

E-FUSE CIRCUIT USING LEAKAGE CURRENT PATH OF TRANSISTOR

BACKGROUND OF THE INVENTION

1. Field of the Invention

Embodiments of the invention relate to a fuse circuit. More particularly, embodiments of the invention relate to an e-fuse circuit using a transistor leakage current path.

2. Description of the Related Art

Fuse circuits are regularly included with semiconductor circuits for a number of different reasons. For example, many semiconductor memory circuits include a collection of fuses as part of circuitry enabling memory redundancy. In this context, it is well known that memory devices, such as Dynamic Random Access Memory (DRAM), are manufactured to include a large number of memory cells. Should only a few of these memory cells be defective, the entire memory device is often considered unusable. Thus, the consistent appearance of only a few bad memory cells in a much larger array of memory cells will adversely affect manufacturing yield for the memory device. As a result, provision for a number of redundant memory cells adapted to replace the defective memory cells identified in a memory device is commonly made.

In another example, fuses are also used within a semiconductor device to implement electronic identification for the device. So-called "electronic chip identification" provides reference information for the device, such as location coordinates for the device within a wafer being fabricated. By resort to this reference information, a manufacturer may also search manufacturing data related to a particular semiconductor device.

Conventional fuses are made of polysilicon or metal, and a programming circuit is typically required to control a conductivity state (e.g., open or short) for the fuse circuit, regardless of its material composition.

Various conventional techniques have been used to program a fuse. These techniques include selectively applying an over-current to the fuse, or directing a laser beam onto a coupling connection for the fuse, etc. Conventional techniques that selectively direct a laser beam in order to program the conductivity state of a fuse are widely used because of their high reliability and simplicity. However, such programming techniques do not provide an ability to repair a memory device once it is placed into a package.

This type of limitation resulted in the development of an electronic fuse ("e-fuse"). The use of e-fuses allows a fusing operation to be performed at the package level of a semiconductor device (e.g., at a fabrication stage following the assembly process). The conductivity state of an e-fuse has been conventionally defined by melting a fuse coupling, by defined electrical carrier migration, etc. Many of thee techniques are accomplished by selectively applying an electrical bias voltage or current to a fuse to vary its conductivity. For example, a program voltage $V_{pgm}$ and a program current $I_{pgm}$ may be supplied to a fuse for a predetermined programming period in order to define its conductivity state. As a result of these applied bias signals, electrical carriers may migrate from one or more fuse components to thereby vary the electrical resistance of the fuse. In various conventional examples, the fuse will exhibit either a short circuit condition or a highly resistive condition.

A conventional e-fuse is disclosed, for example, in Korea Patent No. 0363327. In this type of e-fuse, a resistance ratio between the fuse resistance and a reference resistance is detected by a latch type sensor. In order to establish a desired resistance ratio, the e-fuse must be subjected to a defined program current for a predetermined programming period in order to maintain reproducibility and reliability of the fuse programming operation.

Unfortunately, consistent (i.e., highly reliable and reproducible) programming results are sometime difficult to obtain, since a fuse's response to an applied program current may vary in accordance with certain fabrication process variations. Thus, if a relatively excessive program current is applied, heat may be generated in and around the fuse before the fuse is properly programmed. This heat may damage certain layers of the semiconductor device and/or result in low reproducibility and reliability of the fuse programming operation.

Therefore, a demand exists for an e-fuse and related method of programming that produces greater reproducibility and increased reliability. Fuse programming should not be subject to variable influences resulting from variations in the fabrication processes used to make the fuse. The structure of the e-fuse should enjoy considerable immunity to relatively high programming voltages and/or relatively excessive programming current.

SUMMARY OF THE INVENTION

Embodiments of the invention provide an e-fuse exhibiting improved reproducibility and reliability of programming despite potential variations in process. Embodiments of the invention also enjoy much greater immunity to relatively high programming voltage and relatively excessive programming current.

BRIEF DESCRIPTION OF THE DRAWINGS

Several embodiments of the invention are described with reference to the drawings in which.

DESCRIPTION OF EXEMPLARY EMBODIMENTS

Reference will now be made to certain embodiments of the invention. However, it should be noted that the invention is not limited to only the illustrated embodiments. Rather, the embodiments are presented as teaching examples. The scope of the invention is defined by the claims that follow.

Figure 1:
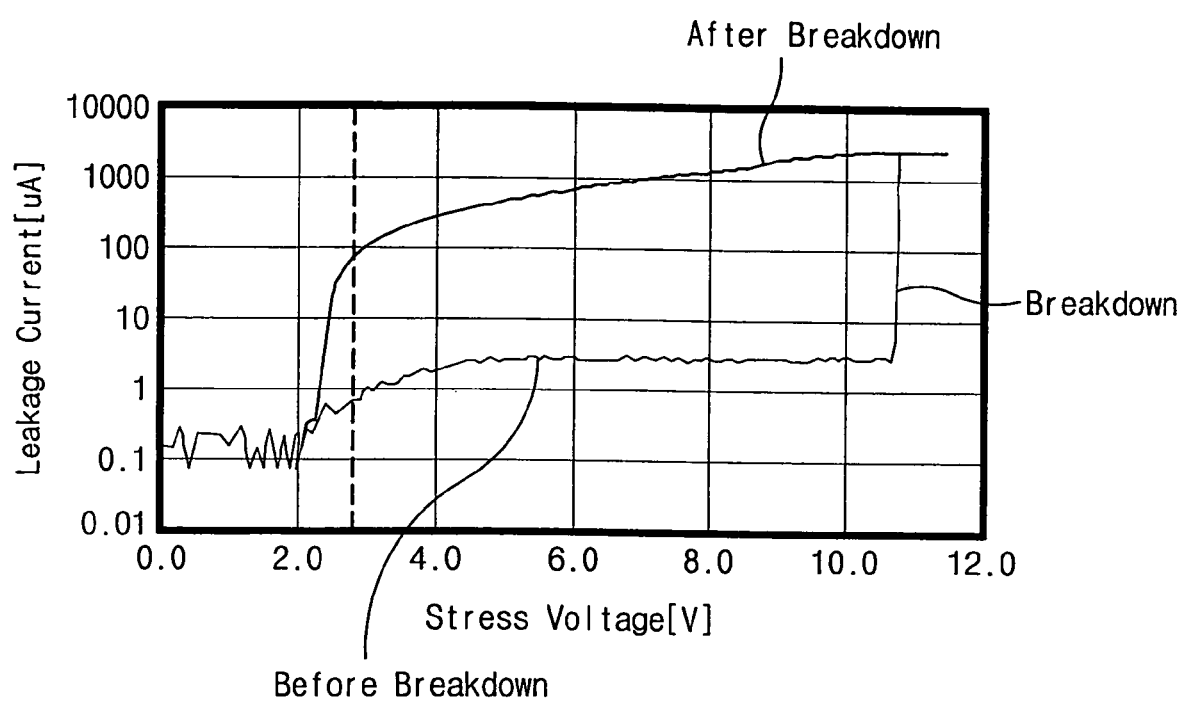
FIG. 1 is a graph showing a dielectric breakdown strength characteristic for a generic semiconductor transistor.

FIG. 1 is a graph showing dielectric breakdown strength characteristic of a generic semiconductor transistor. The horizontal axis of the graph denotes a stress voltage applied to the gate of the transistor. The vertical axis of graph denotes a corresponding leakage current flowing between the gate and drain or between the gate and source.

With reference to FIG. 1, a dielectric breakdown occurs in the generic transistor when a stress voltage of about 11V is applied. Prior to dielectric breakdown, the leakage current for the transistor flowing between the gate and drain, or between the gate and source is fairly steady at one to several microamperes. However, after dielectric breakdown, this leakage current rapidly rises by a factor of many 100's for stress voltages above 3.0V.

With this dielectric breakdown phenomenon as a backdrop, an e-fuse circuit according to one embodiment of the invention will now be described with reference to the circuit diagram of FIG. 2.

Figure 2:
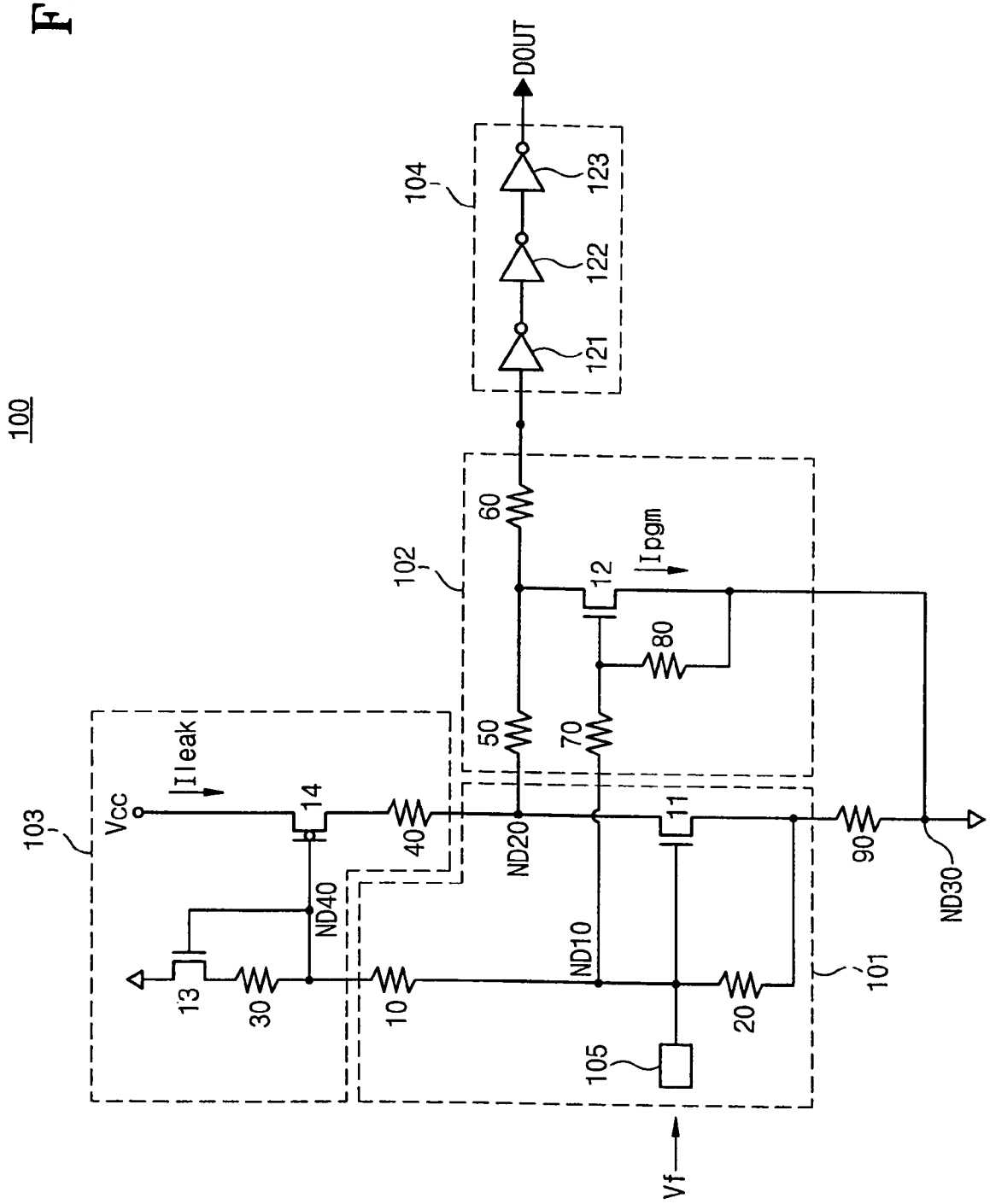
FIG. 2 is a circuit diagram illustrating an e-fuse according to an embodiment of the invention.

Referring to FIG. 2, the exemplary e-fuse may be programmed with a conductivity state in accordance with a difference in leakage current, as it exists before and after a dielectric breakdown in an associated transistor. In the illustrated example, the e-fuse comprises a program circuit 101, a switch circuit 102, a current supply circuit 103 and a sense/amplification circuit 104.

In one embodiment, program circuit 101 is configured in relation to a pad 105 adapted to receive a program voltage "$V_f$", and comprises a program transistor 11 adapted to be programmed by means of a defined leakage current path. Program circuit 101 also comprises input node ND10 and program ND20, where input node ND10 is connected to pad 105. In one specific embodiment, program transistor 11 is an NMOS transistor having a gate connected to input node ND10, a source connected to a ground node ND30 and a drain connected to program node ND20. Ground node ND30 is connected to ground, and program node ND20 is connected to power supply circuit 103. In the illustrated example, program circuit 101 also comprises resistors 10, 20 and 90, which are provided in the circuit to protect program transistor 11 from a high program voltage $V_f$.

In one embodiment, switch circuit 102 comprises an NMOS transistor 12 having a gate connected to input node ND10, a drain connected to program node ND20 and a source connected to ground node ND30. Resistors 50, 60, 70 and 80 are provided to protecting NMOS transistor 12 from a high voltage potentially supplied during a programming operation. In operation, switch circuit 102 connects ground node ND30 to the leakage current path connecting pad 105, the gate of program transistor 11, and the drain program transistor 11 in response to program voltage $V_f$.

Current supply circuit 103 comprises a PMOS transistor 14 having a gate connected to a voltage node ND40, a source connected to a voltage source $V_{cc}$, and a drain connected to program node ND20. Voltage node ND40 is connected to resistors 10 and 30. Current supply circuit 103 also comprises an NMOS transistor 13 having a gate connected to voltage node ND40, a drain connected to resistor 30, and a source connected to ground. In operation, current supply circuit 103 supplies a predetermined level of current to the leakage current path after programming.

Sense/amplification circuit 104 comprises, for example, series of cascaded inverters 121, 122 and 123. The input terminal of inverter 121 is connected to resistor 60 in switch circuit 102. Sense/amplification circuit 104 provides an output voltage $D_{OUT}$ at an output terminal. In operation, sense/amplification circuit 104 senses and outputs a voltage variation apparent at program node ND20 which corresponds to a leakage current difference before and after programming.

Table 1 shows operating states of an e-fuse according to an exemplary embodiment of the invention, such as the circuit shown in FIG. 2. Operations of the exemplary e-fuse will be described with reference to Table 1.

Initially, nodes ND10 and ND40 are assumed to be in logically low states, since input node ND10 is initially connected to ground. Accordingly, program transistor 11 and NMOS transistors 12 and 13 are OFF. (The terms "high" and "low" are used to describe alternate logic states. The terms might easily be reversed if alternate logic is assumed in a different design).

Thereafter, PMOS transistor 14 in current supply circuit 103 turns ON. As a result, a current path is formed connecting voltage source $V_{cc}$ to program node ND20 through PMOS transistor 14. Therefore, program node ND20 becomes logically high in accordance with a developed voltage. In response, sense/amplification circuit 104 generates a low output voltage $D_{out}$.

Then, program voltage $V_f$ is supplied to pad 105 by an external device during a programming operation. Program voltage $V_f$ is greater than the breakdown voltage of program transistor 11. That is, program voltage $V_f$ will be "over-voltage" relative to the rated product voltage.

By supplying a program voltage $V_f$ greater than the defined breakdown voltage, nodes ND10 and ND40 become high. Then, NMOS transistor 13 in current supply circuit 103 turns ON and PMOS transistor 14 turns OFF. That is, the current path formed between voltage source $V_{cc}$ and program node ND20 through PMOS transistor 14 is interrupted.

Since the high voltage is directly transferred to the gate of program transistor 11 connected to input node ND10, dielectric breakdown occurs in program transistor 11. As a result, a leakage current pass is formed between the gate and the drain of program transistor 12. Herein, the program current $I_{pgm}$ passing through the leakage current path flows between the drain and source of NMOS transistor 12. Therefore, sense/amplification circuit 104 outputs a high output voltage.

If the supply of program voltage $V_f$ is stopped, input node ND10 and voltage ND40 become logically low. Accordingly, NMOS transistors 12 and 13 are turned OFF. However, the program transistor 11 in control circuit 101 is turner ON. As a result, a leakage current path is formed between the voltage source $V_{cc}$ and the drain and gate of program transistor 11 through program node ND20. Since the amount of current passing through this transistor arises by a factor of many 100's for a threshold stress voltage (e.g., 3V) is supplied, as compared to amount of current before the dielectric breakdown, program node ND20 is maintained at a logical low that is a program state and outputs a low output voltage.

In the present embodiment, an NMOS transistor is used as program transistor 11 in program circuit 101. However, a PMOS transistor might be used.

As described above, the e-fuse circuit according to an embodiment of the invention discriminates between the leak-

TABLE 1

| State | Pad | Leakage current | Program current | Tr12 | Tr13 | Tr14 | ND10 | ND40 | ND20 | Output |
|---|---|---|---|---|---|---|---|---|---|---|
| Initial | low | About 0 A | — | off | off | on | low | low | high | low |
| Programming | $V_f$ | — | $I_{pgm}$ | on | on | off | high | high | low | high |
| After programming | low | About 100 μA | — | off | off | on | low | low | low | low | age current of a transistor both before and after a dielectric breakdown. In this manner, the e-fuse circuit provides improved programming reproducibility and greater reliability although relatively high voltages and/or excessive currents may be applied during fuse programming. Further, the e-fuse circuit according to the present invention provides stable transistor characteristics without being influenced by process variations.

It will be apparent to those skilled in the art that various modifications and variations can be made to the foregoing embodiments. Thus, it is intended that the present invention covers the modifications and variations of this invention that fall within the scope of the appended claims and their equivalents.

What is claimed is:

1. An e-fuse comprising:
   a pad receiving a high program voltage;
   a program circuit comprising a program node, and a voltage divider formed by a plurality of resistors receiving the high program voltage from the pad and providing a reduced program voltage to the gate of a program transistor, wherein the program transistor is connected between the program node and ground and the programmed state of the program transistor defines a leakage current flowing through a leakage current path;
   a switch circuit connected between the program node and ground, whereby the leakage current path is connected to ground in response to the program voltage;
   a current supply circuit connected to the program node and adapted to supply a predetermined current to the leakage current path after the program transistor is programmed; and
   a sense/amplification circuit connected to the program node, whereby the programmed state of the e-fuse may be sensed and output.

2. The e-fuse of claim 1, wherein the program transistor is an NMOS transistor having a drain connected to the program node, and a source connected to ground.

3. The e-fuse of claim 1, wherein the current supply circuit comprises a PMOS transistor comprising a gate connected to the pad, a source connected to a voltage source and a drain connected to the program node.

4. The e-fuse of claim 1, wherein the sense/amplification circuit comprises at least one inverter.

5. The e-fuse of claim 4, wherein the sense/amplification circuit comprises cascaded series of invertors.

6. The e-fuse of claim 1, wherein the switch circuit comprises an NMOS transistor having a gate connected to an input node within the voltage divider, a drain connected to the program node, and a source connected to ground.

7. An e-fuse comprising:
   a pad receiving a high program voltage;
   a program circuit comprising a program transistor having a gate responsive to the program voltage, wherein the programmed state of the program transistor defines a leakage current flowing through a leakage current path;
   a switch circuit connected between the program circuit and ground, whereby the leakage current path is connected to ground in response to the program voltage;
   a current supply circuit connected to the program circuit and adapted to supply a predetermined current to the leakage current path after the program transistor is programmed, wherein the current supply circuit comprises;
      a PMOS transistor having a gate connected to the pad, a source connected to a voltage source and a drain connected to the program node, and
      an NMOS transistor having a gate and a drain commonly connected between the pad and ground, and a source connected to the drain of the PMOS transistor; and
   a sense/amplification circuit connected to a program node associated with the leakage current path, whereby the programmed state of the e-fuse may be sensed and output.

8. The e-fuse of claim 7, wherein the program transistor is an NMOS transistor having a drain connected to the program node and a source connected to ground.

9. The e-fuse of claim 7, wherein the sense/amplification circuit comprises at least one inverter.

10. The e-fuse of claim 9, wherein the sense/amplification circuit comprises cascaded series of invertors.

11. The e-fuse of claim 7, wherein the switch circuit comprises an NMOS transistor having a gate connected to an input node within the voltage divider, a drain connected to the program node, and a source connected to ground.

12. A method of programming an e-fuse comprising:
   applying a high program voltage to a pad connected to a voltage divider formed by a plurality of resistors to generate a reduced program voltage;
   applying the reduced program voltage to a NMOS program transistor with sufficiently high voltage to cause a dielectric breakdown in the program transistor, wherein the NMOS program transistor is connected between a program node and ground;
   applying a current to the program node following dielectric breakdown; and
   sensing and outputting a voltage difference apparent at the program node and generated by a change in the leakage current before and after the dielectric breakdown.

* * * * *